United States Patent
Liao

(10) Patent No.: US 9,576,820 B2
(45) Date of Patent: Feb. 21, 2017

(54) SEMICONDUCTOR STRUCTURE AND METHOD OF MANUFACTURING THE SAME

(71) Applicant: CHIPMOS TECHNOLOGIES INC, Hsinchu (TW)

(72) Inventor: Tsung Jen Liao, Hsinchu (TW)

(73) Assignee: CHIPMOS TECHNOLOGIES INC, Hsinchu (TW)

( * ) Notice: Subject to any disclaimer, the term of this patent is extended or adjusted under 35 U.S.C. 154(b) by 778 days.

(21) Appl. No.: 13/846,516

(22) Filed: Mar. 18, 2013

(65) Prior Publication Data

US 2014/0061904 A1 Mar. 6, 2014

(30) Foreign Application Priority Data

Aug. 31, 2012 (TW) .............................. 101131681 A

(51) Int. Cl.
*H01L 21/00* (2006.01)
*H01L 21/56* (2006.01)
*H01L 23/28* (2006.01)
*H01L 23/00* (2006.01)
*H01L 23/31* (2006.01)

(52) U.S. Cl.
CPC ............ *H01L 21/56* (2013.01); *H01L 23/28* (2013.01); *H01L 23/3107* (2013.01); *H01L 24/19* (2013.01); *H01L 24/96* (2013.01); *H01L 21/568* (2013.01); *H01L 2224/0401* (2013.01); *H01L 2224/04105* (2013.01); *H01L 2224/12105* (2013.01); *H01L 2224/32225* (2013.01); *H01L 2224/73267* (2013.01); *H01L 2225/1035* (2013.01); *H01L 2225/1058* (2013.01); *H01L 2924/12042* (2013.01); *H01L 2924/181* (2013.01)

(58) Field of Classification Search
CPC ....................................................... H01L 21/00
See application file for complete search history.

(56) References Cited

U.S. PATENT DOCUMENTS 6,291,271 B1 9/2001 Lee et al.
2011/0278736 A1* 11/2011 Lin .................. H01L 25/50
257/774

FOREIGN PATENT DOCUMENTS

| CN | 201655787 U | 11/2010 |
| CN | 102157400 A | 8/2011 |
| CN | 102201382 A | 9/2011 |

OTHER PUBLICATIONS

Office Action issued on Sep. 29, 2014 for the Taiwanese counterpart application 101131681.
English translation for the Office Action issued on Sep. 29, 2014 for the Taiwanese counterpart application 101131681.
Office Action issued on Jan. 5, 2015 for the China counterpart application 201300997260.0.

(Continued)

*Primary Examiner* — Marvin Payen
(74) *Attorney, Agent, or Firm* — WPAT, P.C., Intellectual Property Attorneys; Anthony King

(57) ABSTRACT

A method of manufacturing a chip fan-out structure, said method includes forming a dry film with a predetermined pattern. Providing a chip wherein the distribution of the pad is corresponding to the dry film's predetermined pattern. Contacting the surface of the pad with the dry film. Forming a molding compound to encapsulate the chip, and removing the dry film to expose the pads.

13 Claims, 10 Drawing Sheets

(56) References Cited

OTHER PUBLICATIONS

Search report issued on Jan. 5, 2015 for the China counterpart application 201300997260.0.
English abstract translation of the office Action issued on Jan. 5, 2015 for the China counterpart application 201300997260.0.
English abstract translation of CN102201382A.
English abstract translation of CN102157400A.
English abstract translation of CN201655787U.

* cited by examiner

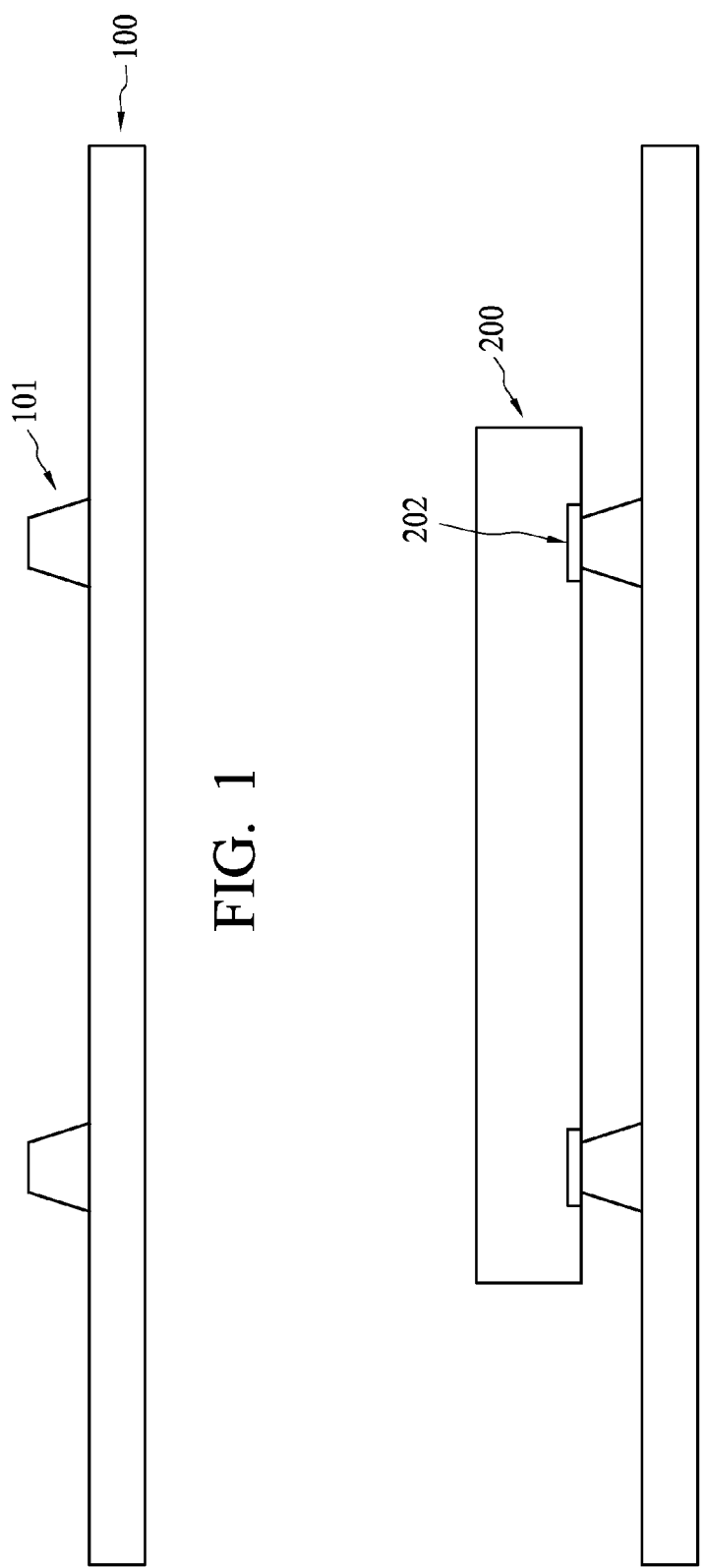

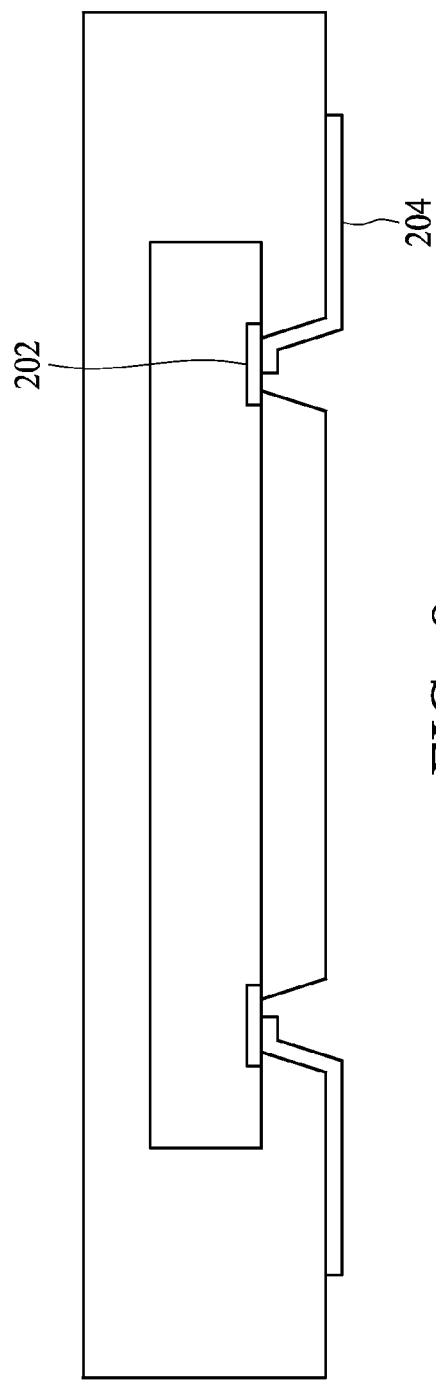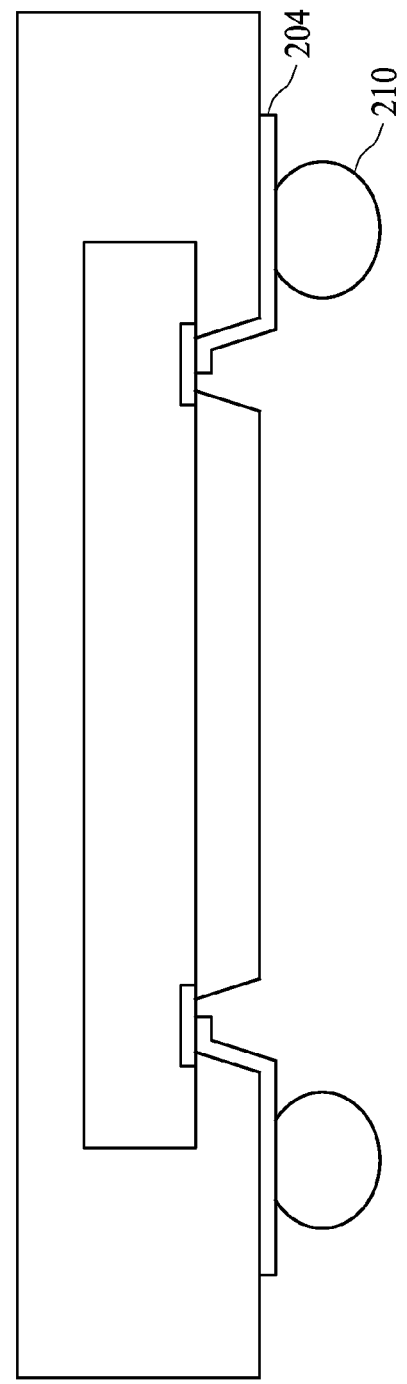

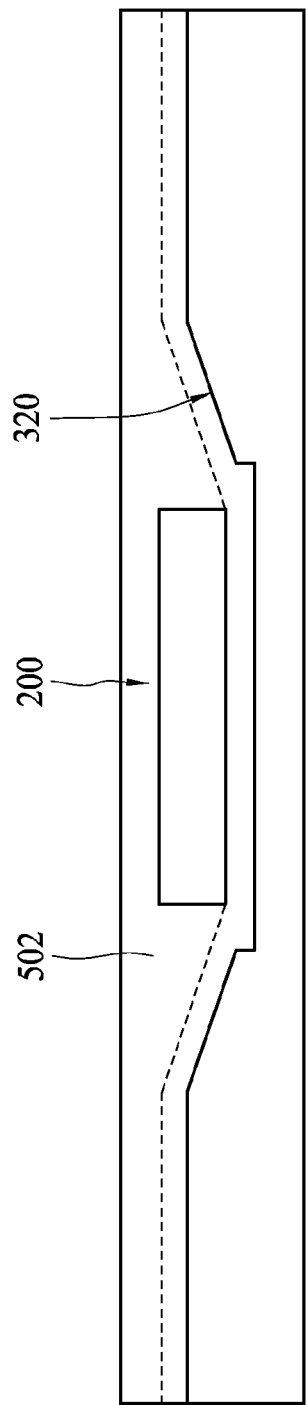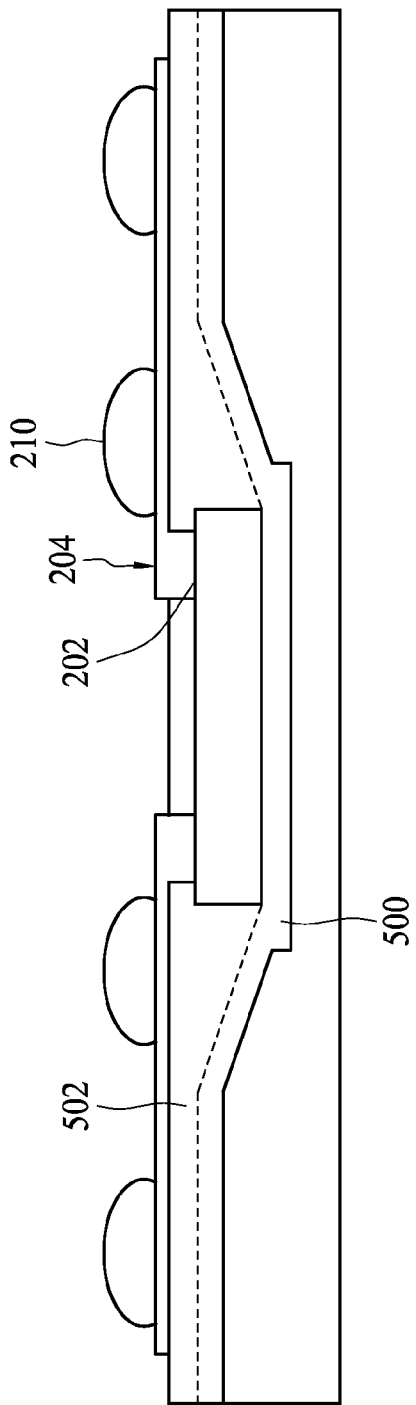

US 9,576,820 B2

SEMICONDUCTOR STRUCTURE AND METHOD OF MANUFACTURING THE SAME

FIELD OF THE INVENTION

The present invention relates in general to a semiconductor package structure, and more particularly to improving a semiconductor fan-out structure.

BACKGROUND

In a semiconductor process, during wafer level packaging, different carriers need to be customized according to different die sizes. In the whole manufacturing process, the carrier is used after the die is welded and is separated for recycling until the fan-out process is completed. Therefore, regarding the production efficiency, the applicability and quantity of the carrier always become a bottleneck. However, if the quantity of the spare carrier is increased accordingly, the cost is also increased.

In addition, as 3D packaging is increasingly demanded to meet the growing requirements of electronic elements with reduced sizes, to implement fan-out wafer level packaging without changing the existing machine, apparatuses and carrier is an important issue to be solved to save the cost.

SUMMARY

The present invention discloses a method for manufacturing a semiconductor package structure, the method includes forming a dry film with a predetermined pattern and providing a chip, wherein the distribution of a pad of the chip is corresponding to the predetermined pattern of the dry film. The method further includes contacting a surface of the pad of the chip with the dry film, and forming a molding compound to encapsulate the chip. The method also has a step of removing the dry film to expose the surface of the pad.

The present invention discloses a method for manufacturing a semiconductor package structure and the method includes providing a substrate and forming a dry film with a predetermined pattern on the substrate, wherein the predetermined pattern is corresponding to a first surface of the substrate. The method further includes forming a molding compound on the substrate to encapsulate the dry film, and removing the substrate. The method also has a step of removing the dry film to make the molding compound have a carrying surface.

A person of ordinary skill in the art should appreciate that the embodiments described below and illustrated with accompanied drawings would not limit the scope of the present invention.

BRIEF DESCRIPTION OF THE DRAWINGS

The invention will be described according to the appended drawings in which:

FIG. 1-4 illustrate a semiconductor structure and manufacturing method of according to one of the embodiment;

FIG. 8 illustrates a semiconductor structure according to one of the embodiment;

FIG. 9 illustrates a semiconductor structure according to one of the embodiment;

FIG. 11-15 illustrate a semiconductor structure and manufacturing method of according to one of the embodiment;

PREFERRED EMBODIMENT OF THE PRESENT INVENTION

The following embodiments of the disclosure are improvements of the existing chip fan-out process. Through the present invention, the fan-out process can be performed on chips with different sizes or layouts on the same substrate; therefore, the substrate does not need to be customized according to the sizes of different chips, so as to increase the production yield and reduce the cost.

Figure 3:
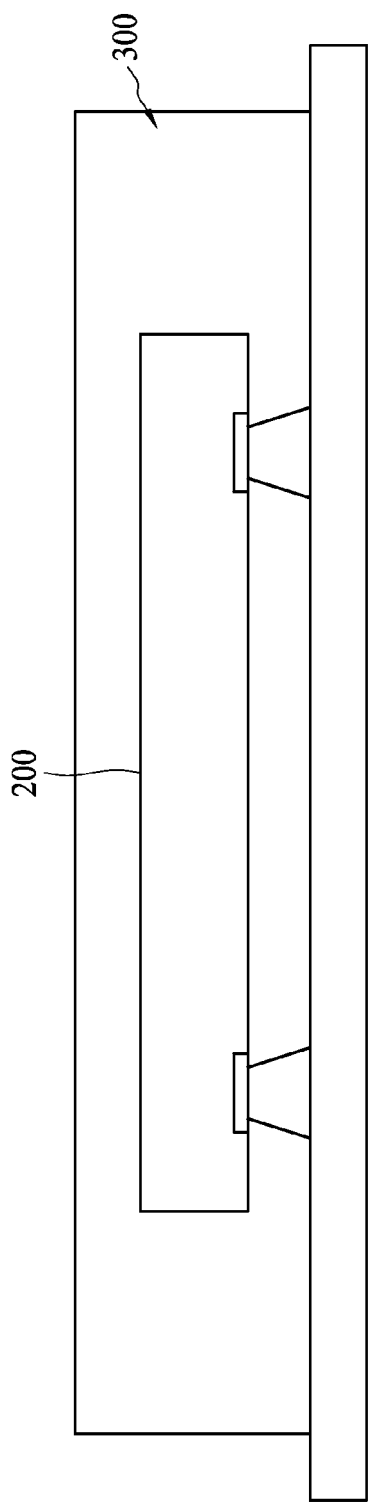
Figure 4:
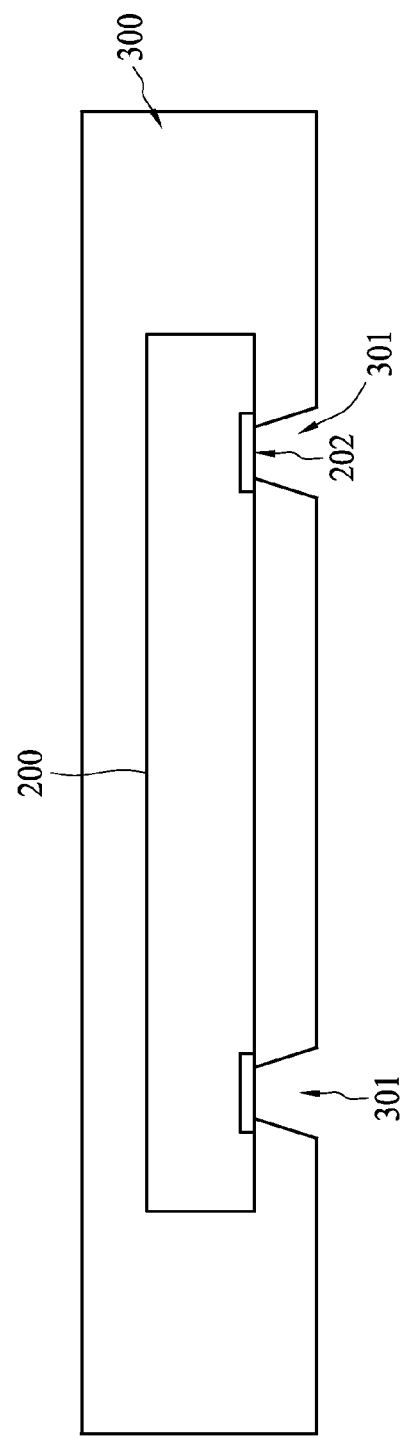

FIG. 1 to FIG. 4 show an embodiment of the present invention, which exemplifies a fan-out process of a chip circuit layer of the present invention. A substrate 100 is provided to carry a dry film 101, and the dry film 101 is formed with a predetermined pattern as shown in FIG. 1. Referring to FIG. 2, a chip 200 is provided. The chip 200 includes a pad 202, and the distribution of the pad 202 is corresponding to the predetermined pattern of the dry film 101. A surface of the pad of the chip 200 is in contact with the dry film 101. In an embodiment, the chip 200 only has the surface of the pad in contact with the dry film 101, so that the pad 202 of the chip 200 is covered. Referring to FIG. 3, a molding compound 300 is formed to encapsulate the chip 200 and the dry film 101. Referring to FIG. 4, the dry film 101 is removed to expose the surface of the pad 202, and an opening 301 corresponding to the pad 202 is formed on the molding compound 300. After the dry film 101 is removed, the surface of the pad 202 is exposed, and the chip 200 is encapsulated in the molding compound 300; therefore, in the subsequent process, the pad 202 of the chip 200 is re-wired to form a fan-out circuit.

As shown in FIG. 8, the fan-out process of the present invention may further include: forming a circuit layer 204. One end of the circuit layer 204 is electrically connected to the surface of the pad 202, and the other end of the circuit layer 204 extends outward along the molding compound 300 to a first surface of the molding compound to form a fan-out circuit. As shown in FIG. 9, the fan-out process of the present invention may also include: forming a solder ball 210 on the circuit layer 204 and electrically connected to the circuit layer 204.

Figure 10:
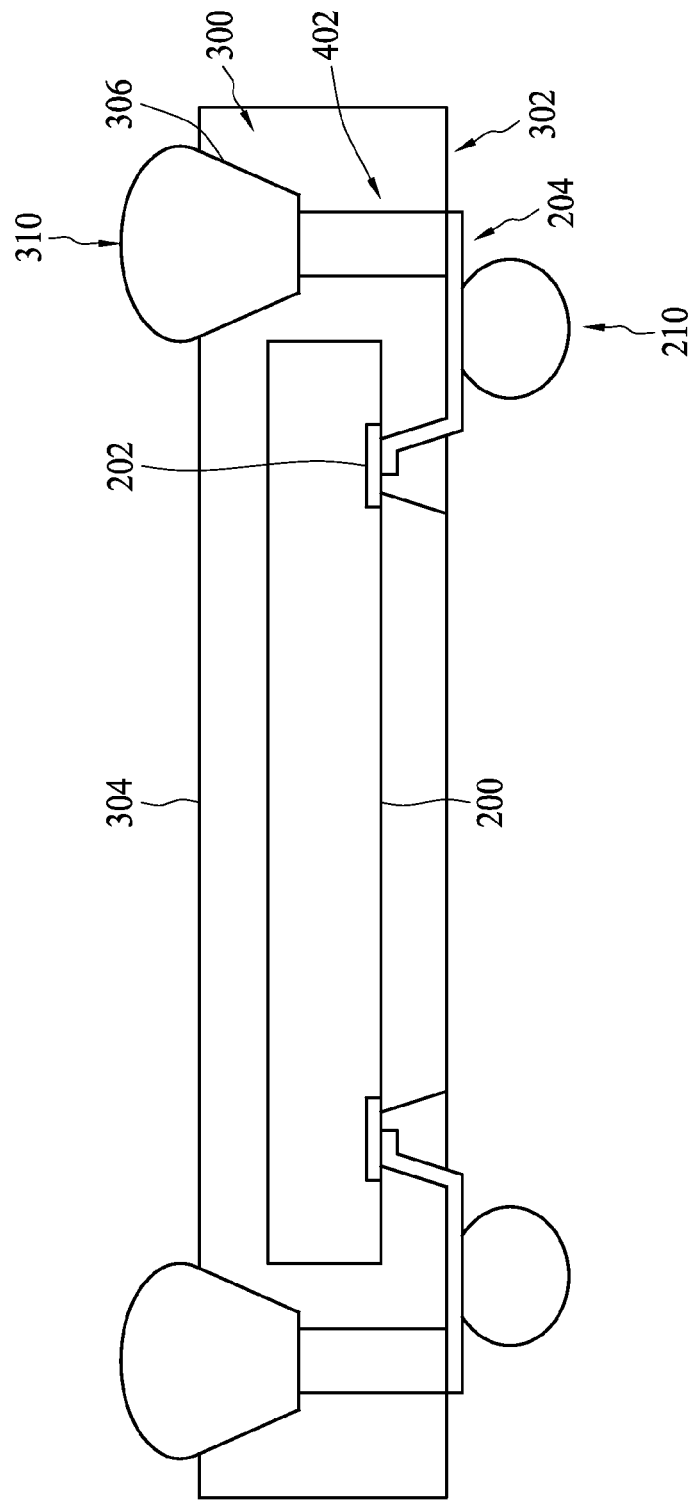
FIG. 10 illustrates a semiconductor structure with TSV according to one of the embodiment.
Figure 11:
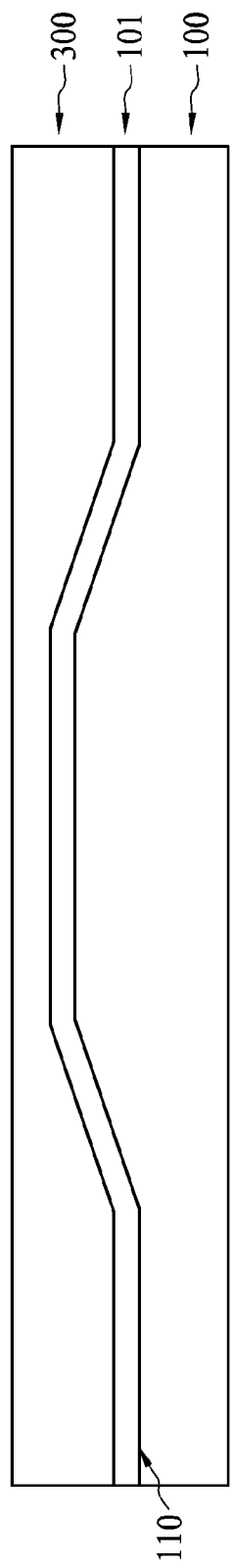

Since the 3D packaging is increasingly demanded, as shown in FIG. 10, the present invention may also include: forming a hole in the molding compound 300. One end of the hole extends to the first surface 302 of the molding compound 300, and a conducting column 402 is formed by an electroplating or a deposition process in the hole. As the conducting column 402 extends to the first surface 302 of the molding compound 300 and is electrically connected to the circuit layer 204, the conducting column 402 may be further electrically connected to the surface of the pad 202 of the chip 200. A hole 306 in communication with the conducting column 402 may be formed by etching, laser processing or other means on a second surface 304 opposite to the first surface 302 of the molding compound 300. A solder ball 310 may be selectively formed in the hole 306, and is electrically connected to the conducting column 402 after a reflow soldering process. Through the solder balls 310 and 210, 3D stacking and electrical connection may be performed on the chip 200 and other chips or elements, so as to complete the 3D stacking and packaging.

Figure 5:
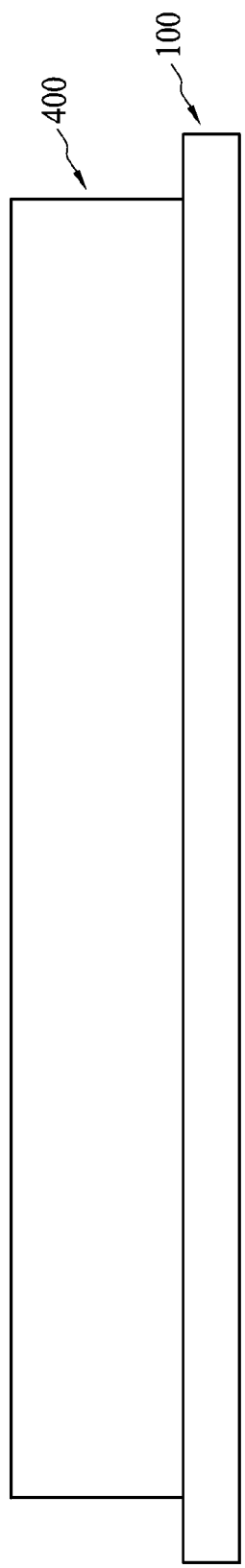
FIG. 5-7 illustrate a semiconductor structure and manufacturing method of according to one of the embodiment.
Figure 6:
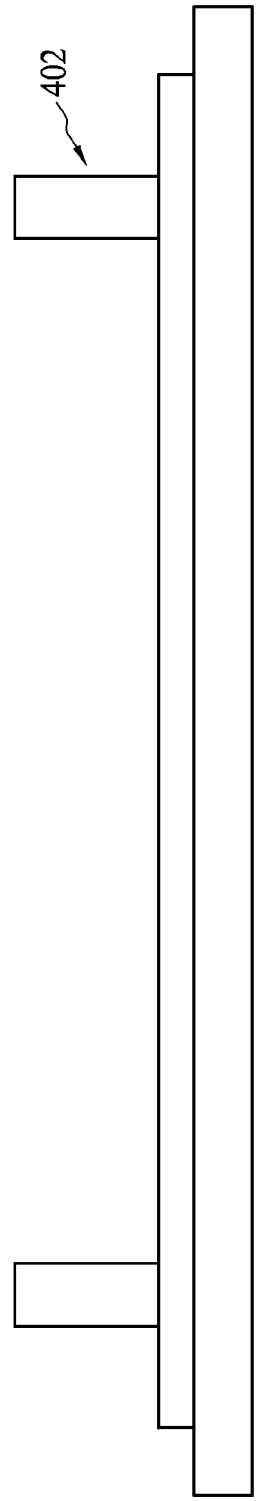
Figure 7:
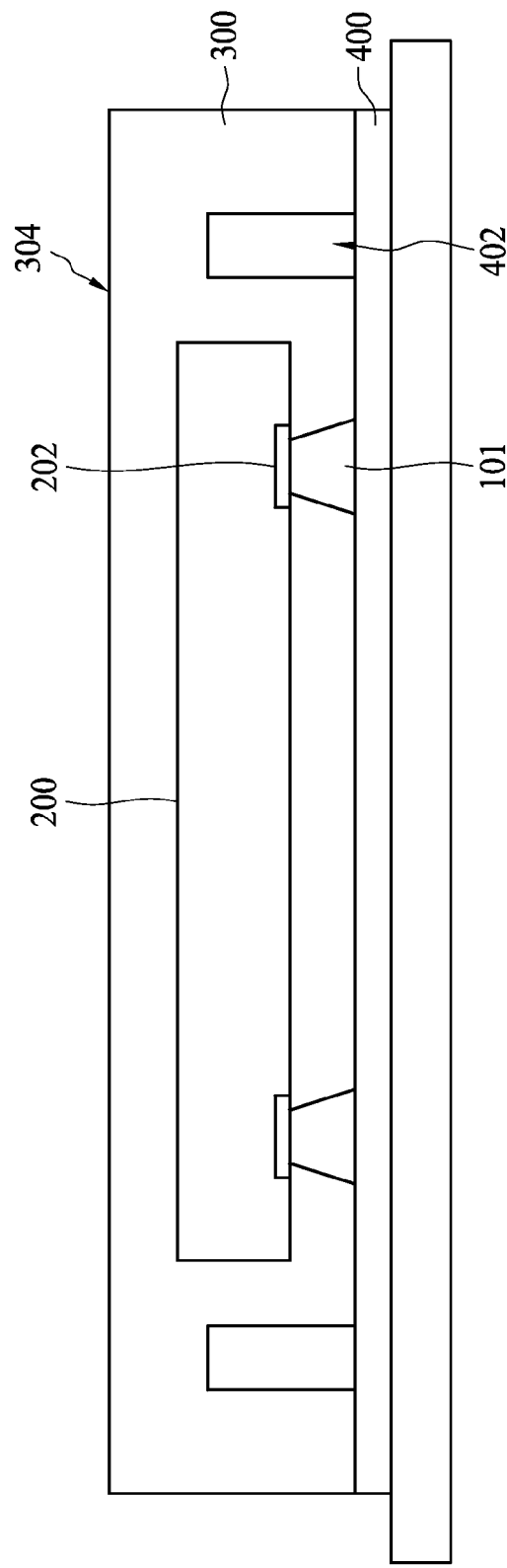

A method for manufacturing a fan-out structure according to the present invention is also shown in FIG. 5 to FIG. 7. First, referring to FIG. 5, a conducting layer 400 is placed on the substrate 100. The material of the conducting layer may be selected from any current conducting material such as gold, silver or copper. In other embodiments, the conducting layer may also be a copper foil. A part of the conducting layer 400 is removed through a patterning process to form a conducting column 402 (referring to FIG. 6). In other embodiments, the conducting column 402 may also be formed through an electroplating process. By using a manner similar to that shown in FIG. 1 to FIG. 2, the dry film 101 is placed on the conducting layer 400 and then patterned (referring to FIG. 7). The pattern of the dry film 101 is corresponding to the distribution of the pad 202 of the chip 200 to be placed on the dry film 101. The chip 200 is then disposed on the patterned dry film 101, and the surface of the pad of the chip 200 is in contact with the dry film 101, so that the pad 202 of the chip 200 is covered to avoid contamination. In an embodiment, the chip 200 only has the surface of the pad 202 in contact with the dry film 101. After the dry film 101, the substrate 100 and the conducting layer 400 are removed, the surface of the pad 202 is exposed, and the chip 200 is encapsulated in the molding compound 300; therefore, the pad 202 is re-wired to form the fan-out circuit layer 204, and a ball implanting process is then performed to form the solder ball 210 on the circuit layer 204. In other embodiments, the solder ball 210 may also be directly formed in the opening 301, which is corresponding to the pad 202, on the molding compound 300.

Since the 3D packaging is increasingly demanded, as shown in FIG. 10, the present invention may also include: through the conducting column 402 encapsulated in the molding compound 300, forming a hole 306 in communication with the conducting column 402 by etching, laser processing or other means on the second surface 304 opposite to the first surface 302 of the molding compound 300. A solder ball 310 may be selectively formed in the hole 306, and is electrically connected to the conducting column 402 after a reflow soldering process. Through the solder ball 310, 3D stacking and electrical connection may be performed on the chip 200 and other chips or elements, so as to complete the 3D packaging.

Figure 12:
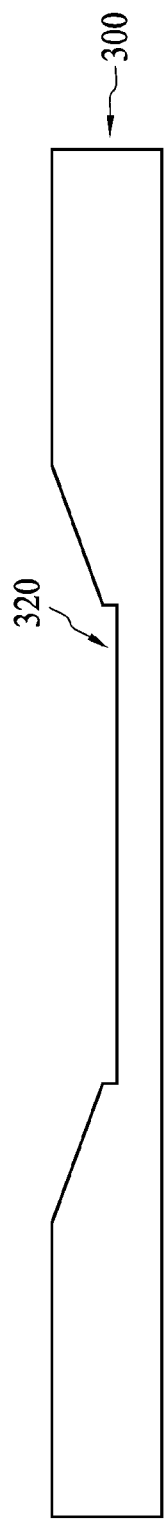

A method for manufacturing a fan-out structure according to the present invention is also shown in FIG. 11 to FIG. 14. First, a substrate 100 is provided. A dry film 101 is formed with a predetermined pattern on the substrate 100, the predetermined pattern being corresponding to a first surface 110 of the substrate 100. A molding compound 300 is formed on the substrate 100 to encapsulate the dry film 101. As shown in FIG. 12, the substrate 100 and the dry film 101 are removed, and the molding compound 300 after the removal has a carrying surface 320, the shape of which is inverted to that of the first surface 110 of the substrate 100. In this embodiment, the carrying surface 320 is an inward recessed surface. As shown in FIG. 13, a first dielectric layer 500 is formed in the inward recessed carrying surface 320. The manner for forming the first dielectric layer 500, for example, chemical vapour deposition (CVD) or spin coating, may be adjusted upon requirements, and in this embodiment, spin coating is selected. After the spin coating, a first dielectric layer 500 with a flat surface is formed, and a chip 200 is disposed above the first dielectric layer 500. In this embodiment, the dielectric layer may be a die attach adhesive. A second dielectric layer 502 is formed by CVD or coating in the carrying surface 320 and covers the chip 200. As shown in FIG. 14, a circuit layer 204 is formed on the second dielectric layer 502 and electrically connected to the pad 202 of the chip 200. In an embodiment shown in FIG. 14, after the circuit layer 204 is laid above the second dielectric layer 502, the solder ball 210 is disposed on the circuit layer 204, and the subsequent packaging process is performed.

Figure 15:
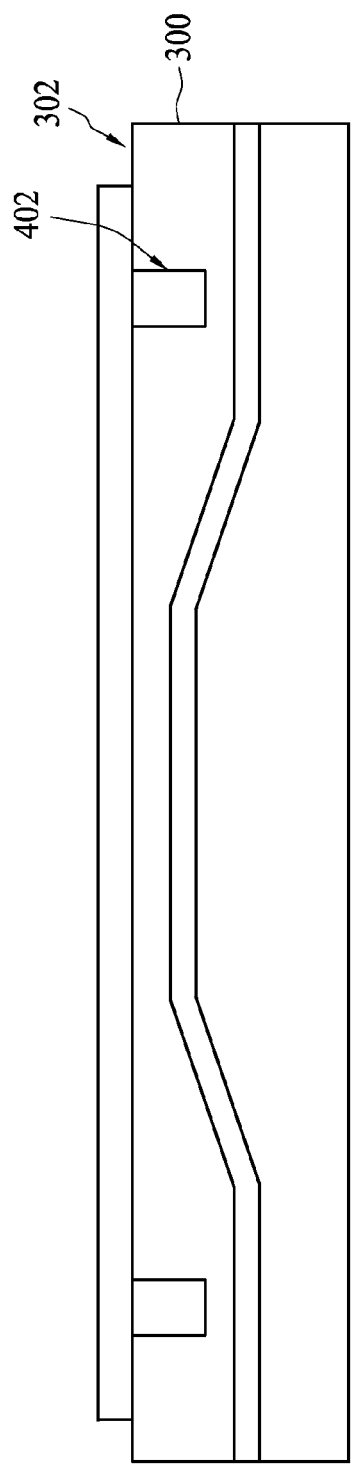
Figure 16:
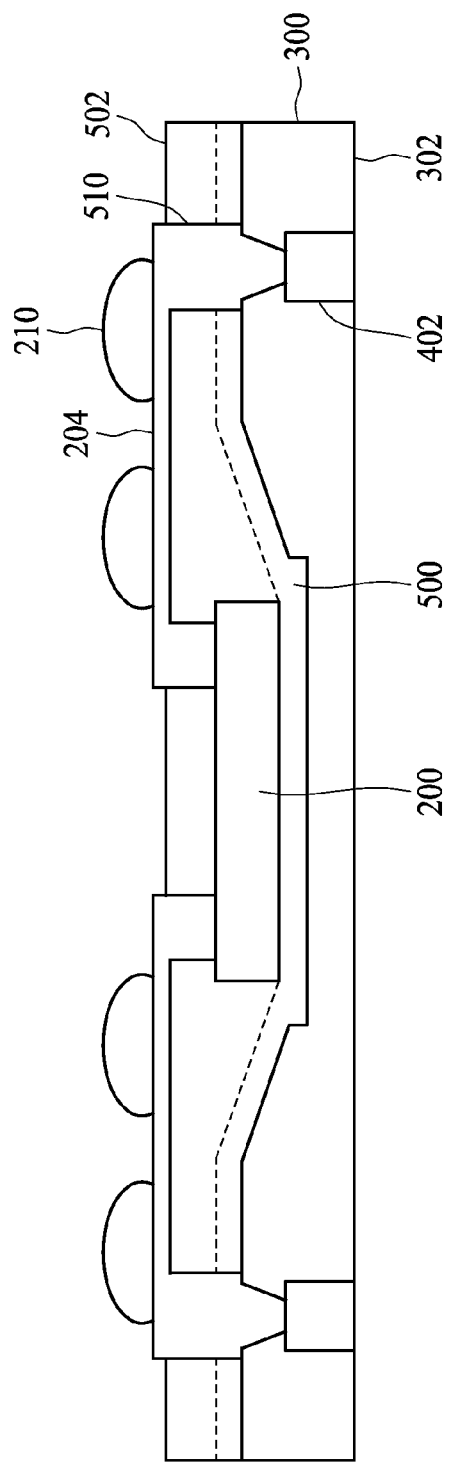
FIG. 16 illustrates a semiconductor structure with TSV according to one of the embodiment.
Figure 17:
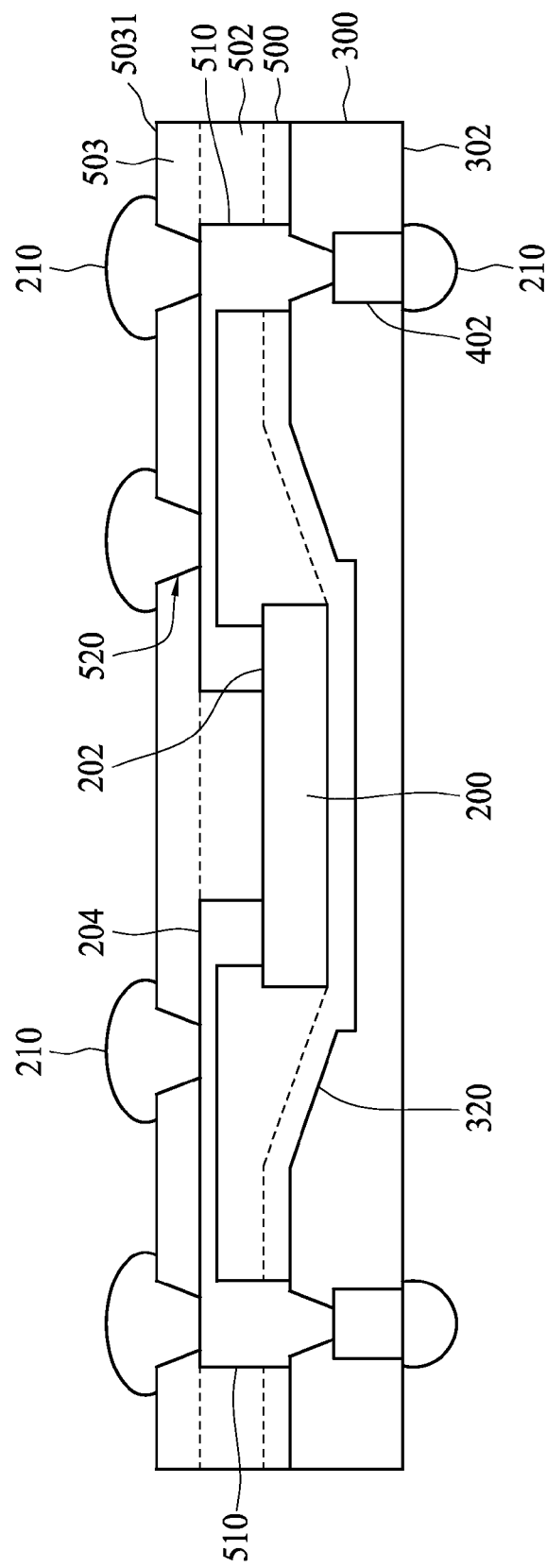
FIG. 17 illustrates a semiconductor structure with TSV according to one of the embodiment.

In another embodiment of the present invention, as shown in FIG. 15, a conducting column 402 is formed in the molding compound 300. This step may be performed subsequent to the step of forming the molding compound 300 on the substrate 100 in FIG. 11, and can be performed when the molding compound 300 is completely cured, but the present invention is not limited thereto. One end of the conducting column 402 extends to the first surface 302 of the molding compound 300. A patterning process as shown in FIG. 5 to FIG. 6 may be performed to remove a part of the conducting layer 400 to form the conducting column 402. As shown in FIG. 16, after the second dielectric layer 502 is formed, a hole 510 extending from the first and the second dielectric layer to one end of the conducting column 402 in the molding compound 300 is formed by, for example, etching. The circuit layer 204 is formed by electroplating, sputtering or other means, and then electrically connected to the conducting column 402 and the chip 200. As shown in FIG. 17, a third dielectric layer 503 is covered on the second dielectric layer 502, a second hole 520 is formed on a first surface 5031 of the third dielectric layer 503, and a solder ball 210 is placed on the third dielectric layer 503 and electrically connected to the circuit layer 204. A solder ball 210 is further formed on the first surface 302 of the molding compound 300 and is electrically connected to the conducting column 402.

The first, second, and third dielectric layers may be respectively coated and then cured by baking. In this manner, through the above process, the pad 202 on the chip 200 may be fan-out through the circuit layer 204, and electrically connected to different elements through the solder balls 210 on the third dielectric layer 503 and the first surface 302 of the molding compound 300 respectively, so as to complete the 3D packaging process. It can be seen from the foregoing embodiments that, the present invention only needs to customize a substrate according to the size of one chip, and the substrate can be prepared for use in advance. Besides, the present invention can directly replace the conventional 2.5D and the existing 3D Through Silicon Via (TSV) packaging technologies with a low cost.

The methods and features of this invention have been sufficiently described in the above examples and descriptions. It should be understood that any modifications or changes without departing from the spirit of the invention are intended to be covered in the protection scope of the invention.

What is claimed is:

1. A method for manufacturing a semiconductor package structure, comprising:
   forming a dry film with a predetermined pattern;
   providing a chip, the distribution of a pad of the chip being corresponding to the predetermined pattern of the dry film;
   contacting a surface of the pad of the chip with the dry film;
   forming a conducting column;
   forming a molding compound to encapsulate the chip and the conducting column;

encapsulating the conducting column by using the molding compound; and removing the dry film to expose the surface of the pad.

2. The manufacturing method according to claim 1, wherein the chip only has the surface of the pad in contact with the dry film.

3. The manufacturing method according to claim 1, wherein one end of the conducting column extends to a first surface of the molding compound and is electrically connected to the surface of the pad of the chip.

4. The manufacturing method according to claim 1, further comprising: providing a substrate to carry the dry film.

5. The manufacturing method according to claim 4, further comprising: placing a conducting layer on the substrate.

6. The manufacturing method according to claim 5, further comprising: patterning the conducting layer to form the conducting column.

7. The manufacturing method according to claim 6, wherein the chip only has the surface of the pad in contact with the dry film.

8. The manufacturing method according to claim 1, further comprising: forming a circuit layer on the surface of the pad of the chip.

9. The manufacturing method according to claim 8, further comprising: extending the circuit layer to the first surface of the molding compound.

10. The manufacturing method according to claim 9, further comprising: forming a solder ball on the circuit layer.

11. The manufacturing method according to claim 9, further comprising: extending the circuit layer to be electrically connected to the conducting column.

12. The manufacturing method according to claim 11, further comprising: forming a hole on a second surface opposite to the first surface of the molding compound, the hole being communicated with the conducting column.

13. The manufacturing method according to claim 12, further comprising: forming a solder ball in the hole.

* * * * *